United States Patent [19]
Takaya et al.

[11] Patent Number: 5,225,969
[45] Date of Patent: Jul. 6, 1993

[54] MULTILAYER HYBRID CIRCUIT

[75] Inventors: Minoru Takaya; Yoshinori Mochizuki, both of Ichikawa; Katsuharu Yasuda, Tokyo, all of Japan

[73] Assignee: TDK Corporation, Tokyo, Japan

[21] Appl. No.: 627,692

[22] Filed: Dec. 14, 1990

[30] Foreign Application Priority Data

| Dec. 15, 1989 | [JP] | Japan | 1-326866 |
| Feb. 20, 1990 | [JP] | Japan | 2-38768 |
| Oct. 31, 1990 | [JP] | Japan | 2-294424 |

[51] Int. Cl.$^5$ .................. H05K 1/11; H05K 1/16
[52] U.S. Cl. .................. 361/414; 174/255; 174/257; 174/256; 174/260; 174/261; 174/263; 336/200; 361/392; 361/400; 361/401; 361/406; 361/409; 361/402; 361/417
[58] Field of Search ........... 174/251, 252, 261, 262, 174/264, 267, 392, 393; 361/401, 404, 406, 408, 414; 439/44, 45, 65, 66, 75, 80, 81, 82, 84; 336/173, 183, 184, 189, 200, 232

[56] References Cited

U.S. PATENT DOCUMENTS

| 3,346,689 | 10/1967 | Parstorfer | 361/414 |
| 3,398,232 | 8/1968 | Hoffman | 361/414 |
| 3,484,654 | 12/1969 | Honeiser | 317/101 |
| 3,843,951 | 10/1974 | Maheux | 339/17 F |
| 3,987,386 | 10/1976 | Valliere | 336/192 |
| 4,075,591 | 2/1978 | Haas | 336/232 |
| 4,161,346 | 7/1979 | Cherian et al. | 439/66 |
| 4,199,209 | 4/1980 | Cherian et al. | 439/66 |
| 4,322,698 | 3/1982 | Takashi et al. | 333/184 |
| 4,328,531 | 5/1982 | Nagashima et al. | 361/401 |
| 4,342,143 | 8/1982 | Jennings | 29/25.42 |
| 4,371,744 | 2/1983 | Badet et al. | 174/68.5 |
| 4,437,140 | 3/1984 | Ohyama et al. | 361/402 |
| 4,494,100 | 1/1985 | Stengel et al. | 336/200 |
| 4,754,371 | 6/1988 | Nitta et al. | 361/411 |
| 4,764,848 | 8/1988 | Simpson | 361/408 |
| 4,874,721 | 10/1989 | Kimura et al. | 174/261 |
| 4,899,118 | 2/1990 | Polinski, Sr. | 361/414 |

FOREIGN PATENT DOCUMENTS

| 76455 | 1/1984 | Japan. | |
| 279622 | 4/1987 | Japan. | |
| 0061015 | 3/1989 | Japan | 361/392 |

OTHER PUBLICATIONS

"Basic Electronics" 4th Ed., Bernard Grob, 1977, pp 359 and 370.

Primary Examiner—Leo P. Picard
Assistant Examiner—D. Sparks
Attorney, Agent, or Firm—Martin Novack

[57] ABSTRACT

A multilayer hybrid circuit having a laminated body having at least one of a plurality of dielectric layers, dielectric magnetic layers, and conductive patterns on said dielectric layers and said magnetic layers, is produced through a printing process and a sintering process, and comprises capacitors, inductors, and resistors. An external connection is effected by side terminals positioned on side walls of the laminated body. A coupling conductor which is perpendicular to a dielectric plane is provided for coupling elements on different planes. Said coupling conductor is a succession of essentially S-shaped conductor chips or lines with the ends connected to adjacent conductor chips on different planes. That coupling conductor functions via a through hole conductor in a prior printed circuit board, and has high operational reliability in a component which is produced through a sintering process. In one embodiment, an inductor is produced by a pair of coils connected in series with each other to reduce the thickness of the laminated body while providing high inductance.

12 Claims, 16 Drawing Sheets

(g)

(h)

(i)

MULTILAYER HYBRID CIRCUIT

BACKGROUND OF THE INVENTION

The present invention relates to an improvement of a multilayer hybrid circuit which has a laminated printed circuit board including, at least, inductors, capacitors, and resistors in the printed circuit board itself.

Conventionally, electronic components are mounted on the surface of a printed circuit board, and the wiring among the components is effected through printed wiring on the surface of the board. However, the high density mounting of electronic components requires improvements for mounting components, and/or the structure of components themselves.

The U.S. Pat. No. 4,322,698 provides one solution for high density mounting, and discloses a multilayer hybrid circuit which has a laminated printed circuit board which includes an inductor, a capacitor and/or a resistor. Since those components are produced in a board (not on the surface of the board), the size of the system can be miniturized, and high density mounting becomes possible.

FIG. 1 shows such prior multilayer hybrid circuit. In FIG. 1, a laminated body has a plurality of dielectric laminated layers 23 and a plurality of conductive films 24 so that those conductive films 24 and those dielectric layers 23 compose a plurality of capacitors 25.

In FIG. 1, inductors 16 having an internal conductor 14 and a ferrite layer 15 are also provided. In producing an inductor, an U-shaped conductive pattern 14a is printed, next a ferrite pattern which is dielectric is deposited so that a window is kept at the one end of said U-shaped pattern 14a. Next, another U-shaped conductive pattern 14b is deposited on the ferrite pattern so that end of the pattern 14a at the window of the ferrite pattern is connected to the end of the second pattern 14b. Thus, one turn coil is produced by a pair of U-shaped conductive patterns 14a and 14b. By repeating the above process, an inductor with a plurality of turns 14a and 14b is produced. Similarly, another inductor having U-shaped patterns 14c and 14d is produced.

A glass layer 26 is attached on at least one surface of the laminated body 1A, and a resistor network 9 which has a resistor layer 28 and a conductive layer 27 is attached on said glass layer 26. A printed wiring pattern 10 is deposited on at least one surface of the laminated body 1A, and a plurality of side terminals 3 for external connection are deposited on the sides of the laminated body 1A. The conductive pattern 10 is used for mounting an electronic component 22 (for instance an integrated circuit, or a transistor) on the laminated body 1A. The laminated body 1A is produced through a thick film printing process, and a sintering process. An external electronic component 22 is soldered on the conductive pattern 10 by soldering a terminal wire 12 of the component 22 to the conductive pattern 10 by the solder 13.

However, a prior art multilayer hybrid circuit of FIG. 1 has the disadvantage that wiring between a surface component, and a capacitor, an inductor, or a resistor is effected by using a surface printed conductive pattern 10 and a side terminal 3 deposited on the surface of the laminated body. When a complicated external component 22 which has many external wiring pins is mounted on the board, the wiring pattern 10 must also be complicated. Thus, the area or the size of the board for the wiring pattern must be large, and sometimes that area required for wiring is larger than the area for mounting internal passive components. Further, a large number of side terminals 3 must be provided, and the insulation between the side terminals 3 is difficult when the side terminals 3 are so densed.

In order to solve the above problem, the present applicant proposed the structure set forth in the U.S. filing Ser. No. 464,453 and EP filing Ser. No. 90 400 092. That proposal has not layer, but also an inner wiring layer for connection between inner components. The inner wiring layer has a dielectric layer, a conductive pattern deposited on the dielectric layer, and a conductive through hole for connecting electrically conductive patterns on different dielectric layers.

The present invention is an improvement on said previous invention.

The present invention improves in particular that a through hole is improved in a specific structure with high operational reliability.

Another disadvantage of a prior multilayer hybrid circuit is that it is difficult to provide an inductor with high inductance. As the inductance depends upon the number of windings of a coil, the number of the windings must be large when the inductance is high, and that large number of windings results in an increase of the thickness of the hybrid circuit. Therefore, a thin structure having large inductance has been desired.

SUMMARY OF THE INVENTION

It is an object, therefore, of the present invention overcome the disadvantages and limitations of a prior multilayer hybrid circuit by providing a new and improved multilayer hybrid circuit.

It is also an object of the present invention to provide a multilayer hybrid circuit in which operational reliability of a conductor which is perpendicular to dielectric layers is improved.

It is also an object of the present invention to provide a multilayer hybrid circuit in which large inductance is obtained in a small size structure.

The above and other objects are attained by a multilayer hybrid circuit comprising an essentially flat-shaped laminated body which includes at least one selected from a capacitor, an inductor, a resistor, and an inner wiring portion which couples said capacitor, said inductor and/or said resistor with each other, and a plurality of side terminals provided on side walls of said laminated body for external connection of said capacitor, said inductor, and said resistor; said capacitor including a dielectric layer and conductive layers on said dielectric layer; said inductor including a dielectric magnetic layer and a plurality of conductive wire layers composing a coil by sandwiching said magnetic layer between conductive wire layers; said resistor including a dielectric layer and a resistor layer deposited on said dielectric layer together with a conductive layer as a lead line; said inner wiring portion having at least one dielectric layer, a conductive layer deposited on said dielectric layer according to desired wiring pattern; a coupling conductor penetrating said dielectric layers of at least one of said capacitor, said inductor, said resistor and said inner wiring portion, in perpendicular direction to dielectric layer plane, for connecting conductive patterns on different dielectric layers; at least one of said dielectric layers having a hole to accept said coupling conductor; and said coupling conductor comprising a plurality of elongated conductive chips or lines in essentially S-shaped through said hole on said dielectric layer, each of said conductive chips being deposited partly on an adjacent conductor chip and partly on a dielectric layer so that succession of the conductor chips forms an elongated conductor perpendular to dielectric layer plane through said holes on dielectric layers.

Preferably, at least one of said inductors has a plurality of coils having an essentially common axis wound in opposite direction and connected in series on the plane where one ends of each coils reside so that flux by each coils is in the same direction, and wherein conductive wire layer composing a part of each coils are deposited on the same dielectric magnetic layers.

BRIEF DESCRIPTION OF THE DRAWINGS

The foregoing and other objects, features, and attendant advantages of the present invention will be appreciated as the same become better understood by means of the following description and drawings wherein.

DESCRIPTION OF THE PREFERRED EMBODIMENTS

Figure 1:
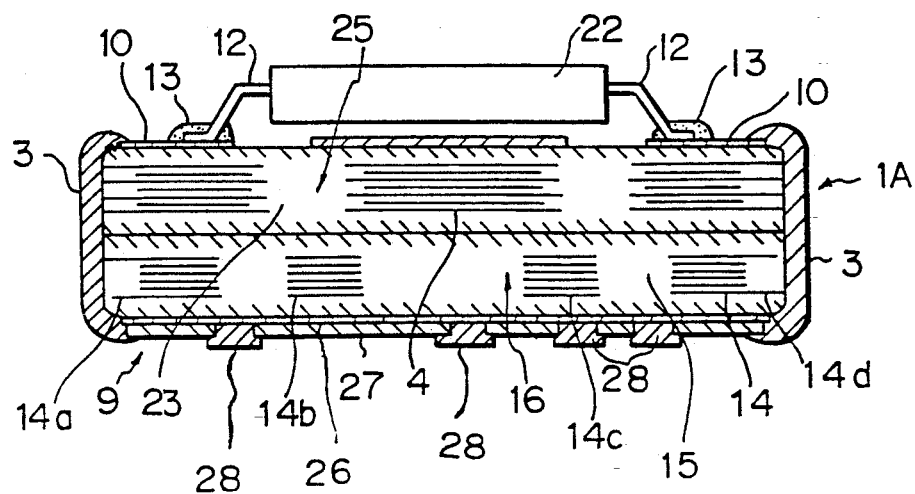
FIG. 1 shows a prior multilayer hybrid circuit.
Figure 2A:
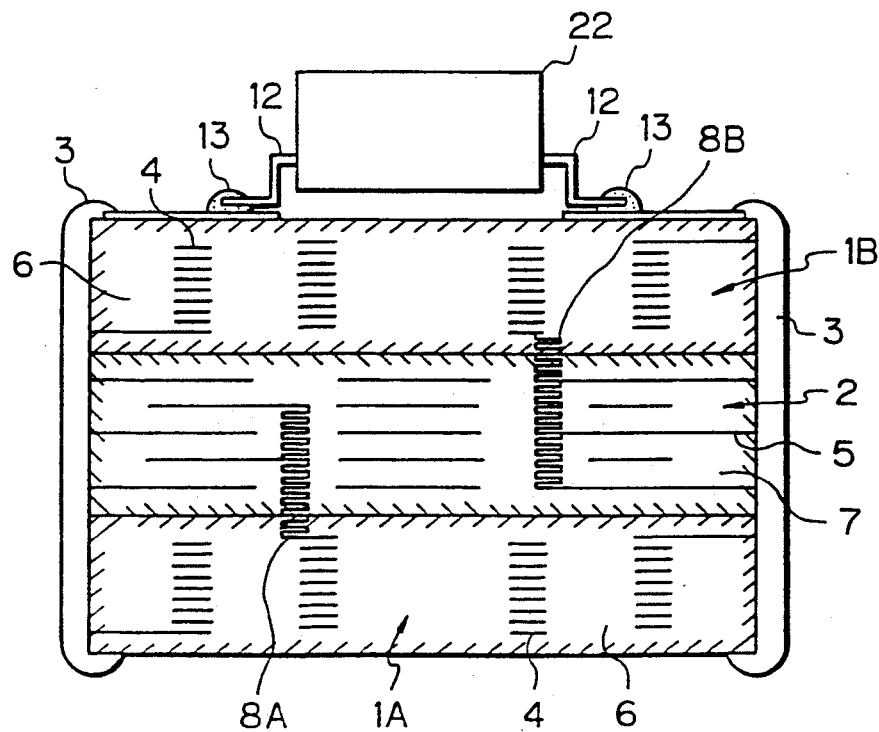
FIG. 2A is a cross section of a multilayer hybrid circuit according to the present invention.
Figure 2B:
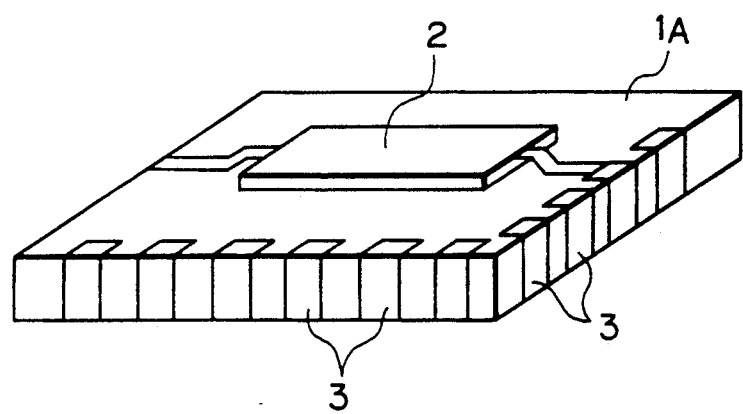
FIG. 2B is a perspective view of the multilayer hybrid circuit of FIG. 2A.
Figure 4:
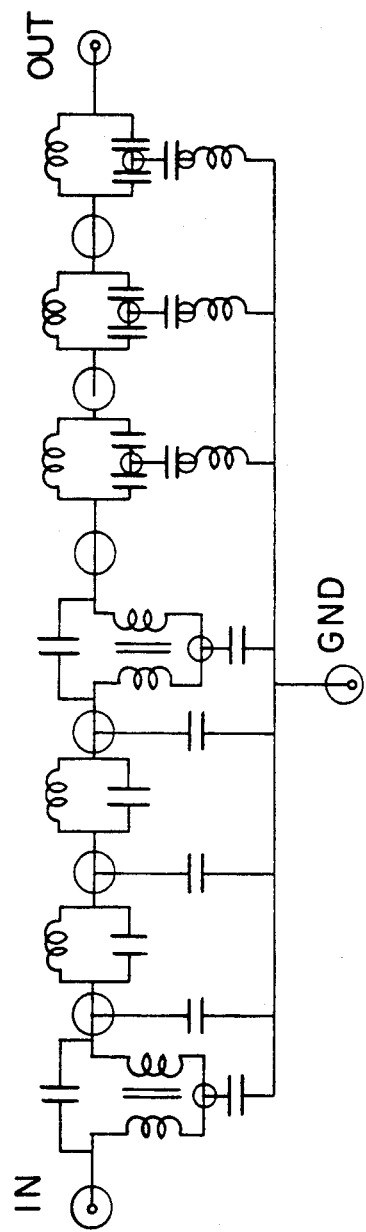
FIG. 4 shows a circuit diagram of an LC filter which uses the multilayer hybrid circuit of FIGS. 2A and 2B.

FIG. 2A shows a cross section of a multilayer hybrid circuit according to the present invention, and FIG. 2B is a perspective view of the same, in which 1A is an inductor, 2 is a capacitor, 1B is another inductor, and 3 is a side terminal which is coupled with a conductor 4 of the inductors 1A and/or 1B, and the electrode conductor 5 of the capacitor 2. It should be noted that the capacitor is sandwiched between the inductors 1A and 1B in order to prevent crosstalk between the inductors in case of a large number of inner elements like an LC filter as shown in FIG. 4.

A resistor and/or an inner wiring portion (not shown) may also be laminated. A resistor layer has a dielectric layer and a resistor layer deposited on said dielectric layer together with a conductive layer as a lead line. An inner wiring portion has at least one dielectric layer, a conductive layer deposited on said dielectric layer according desired wiring pattern for coupling capacitors, inductors, or resistors mounted on the present multilayer hybrid circuit.

Preferably, an ex electronic component, like an integrated circuit, 22 is mounted on the laminated body of the hybrid circuit. Said component is coupled with a side terminal or inner elements through a conductive pattern on the hybrid circuit, or an inner coupling conductor.

A coupling conductor is also provided perpendicular to the dielectric layers so that components and/or conductive patterns on different dielectric layers are electrically connected.

The multilayer hybrid circuit of FIGS. 2A and 2B is produced as follows. An inductor 1A is first produced so that a ferrite layer in the paste form by a binder, and an essentially U-shaped conductive layer are laminated alternately through printing process. An end of the U-shaped conductor 4 on one surface of the ferrite paste layer is coupled with another U-shaped conductor on the surface of another ferrite paste layer so that two U-shaped conductors provide a one turn coil conductor.

A capacitor 2 is then formed on the inductor 1A. The capacitor 2 is produced by laminating a dielectric layer 7 and an electrode conductor 5 alternately through printing process. Further, another inductor 1B is formed on said capacitor 2.

The coupling conductors 8A and 8B are produced simultaneously to make the inductors 1A and 1B, and the capacitor 2.

The laminated body having inductors 1A and 1B, and a capacitor 2, together with the coupling conductors is then sintered. Then, a plurality of side terminals 3 are formed through printing process and sintering process.

In the above lamination process, a coupling conductor 8A and/or 8B for coupling elements on different planes is produced. The coupling conductor 8A connects the inductor 1A to the capacitor 2, and the coupling conductor 8B connects the capacitor 2 to the inductor 1B. Only two coupling conductors 8A and 8B are shown for the simplicity of the drawing, and it should be noted of course that other coupling conductors may be mounted.

Figure 3:
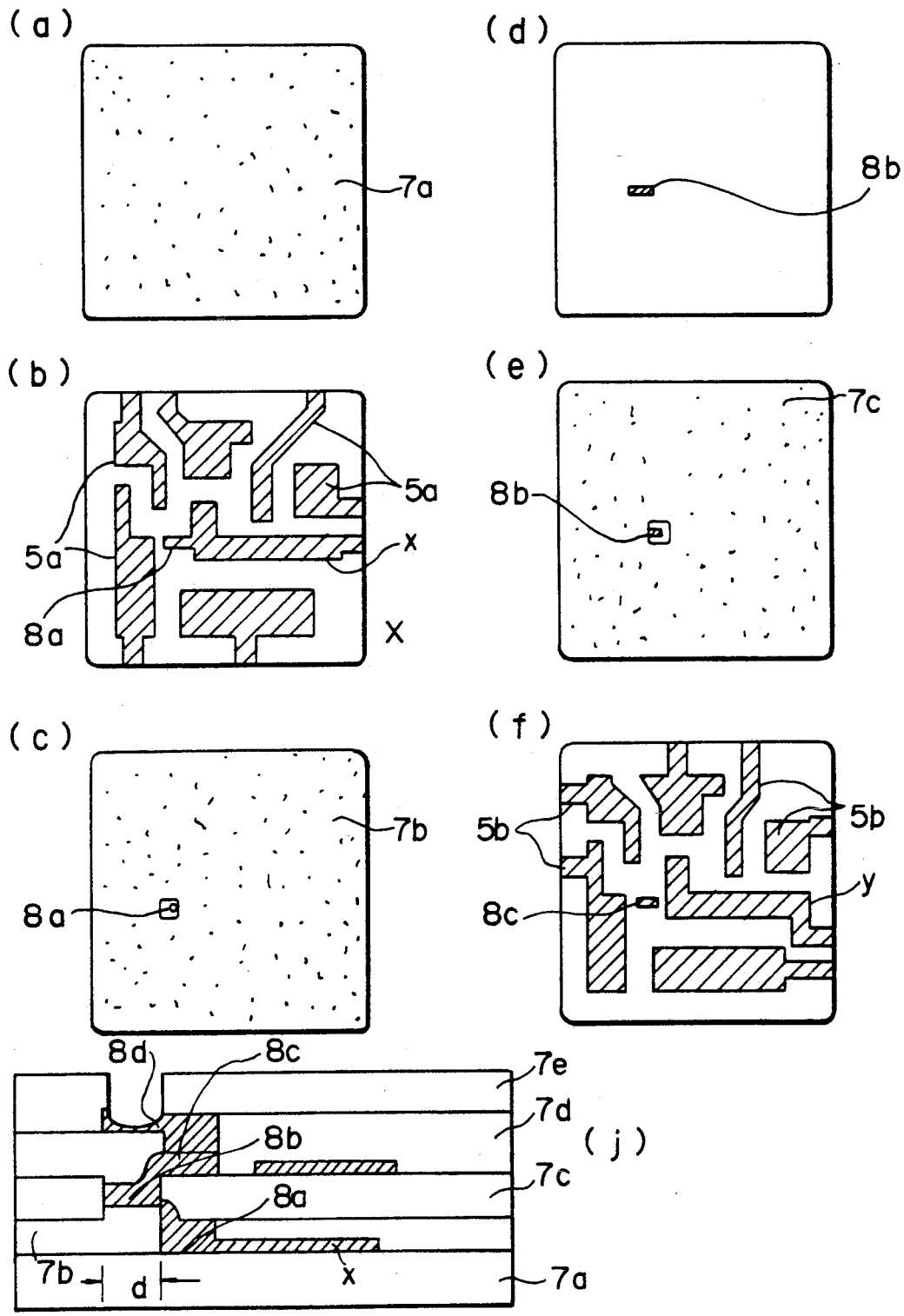
FIGS. 3(a) through 3(j) shows the producing steps of the multilayer hybrid circuit according to the present invention.
Figure 3:
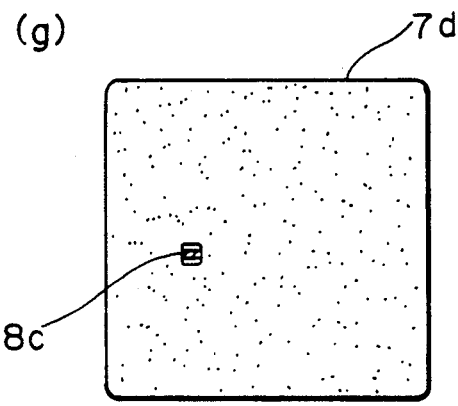
Figure 3:
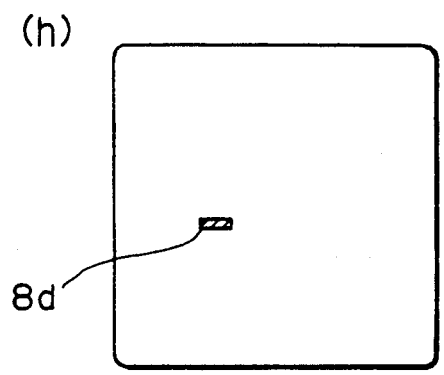
Figure 3:
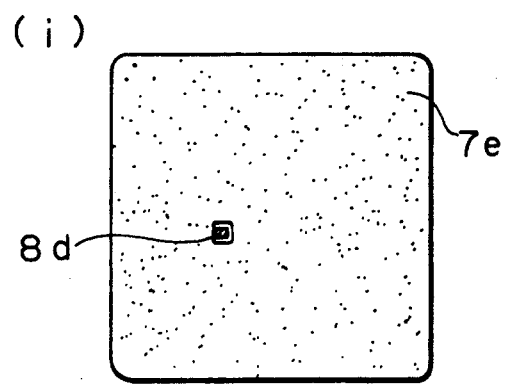

FIG. 3 shows the producing steps of a coupling conductor. In the embodiment, the coupling conductor 8B for connecting the conductor 4 of the inductor 1B to the capacitor 2 is described.

First, the dielectric layer 7a which is made of dielectric powder and binder is placed, on a substrate as shown in FIG. 3(a).

Next, a conductor pattern 5a which relates to a pattern of a capacitor electrode is formed on said layer 7a as shown in FIG. 3(b). In FIG. 3(b), it is assumed that the conductor X is to be connected to the inductor 1B, and the conductor X has the projection 8a, which is to be coupled with a coupling conductor. The conductive paste for the conductive layer 5a and 8a is made of mixture of metal powder including Ag, Ag-Pd, Cu, Ni and Pd, and binder.

Next, a dielectric layer 7b is deposited on the pattern of FIG. 3(b), with a window at the position of the conductive projection 8a, as shown in FIG. 3(c). FIG. 3(j) shows the laminated cross section.

Next, as shown in FIG. 3(d), a conductive chip 8b is provided so that the chip 8b is coupled with the projection 8a, and partly occupies the surface of the dielectric layer 7b (see cross section of FIG. 3(j)) through the window on the dielectric layer 7b. It should be noted that the conductive chip 8b is essentially S-shaped.

Next, as shown in FIG. 3(e), a dielectric layer 7c is provided on the dielectric 7b so that a window opens on a part of the conductor 8b at the opposite end of the conductor 8a. The window in FIG. 3(e) is shifted in view of the window of FIG. 3(c) by the length d so that a coupling conductor extends perpendicular to the dielectric layers in a zigzag manner, or in S-shaped manner. The length d is preferably 300-1200 μm, but d=0 is also possible.

Next, as shown in FIG. 3(f), a conductive pattern 5b which is a counter electrode for the conductive pattern 5a of a capacitor is provided on the dielectric layer 7c. The shape of the pattern 5b differs from that of the pattern 5a in the portions which are coupled with side terminals 3. Simultaneously, a conductor chip 8c which is coupled with the conductor chip 8b is provided so that the end of the chip 8c is on the dielectric layer 7c. The conductive chip 8c does not couple with the conductor Y, which is a counter electrode of the electrode X for providing a capacitor.

The thickness of the dielectric layers between the conductive patterns 5a and 5b in FIGS. 3(b) and 3(f) is 20-150 μm, and it should be appreciated that each printing thickness is 5-10 μm, and therefore a plurality of printing processes are carried out to obtain said thickness (20-150 μm) because single printing process with enough thickness is impossible due to rapid dry feature of the dielectric paste.

Next, as shown in FIG. 3(g), the dielectric layer 7d is provided on the pattern of FIG. 3(f) with a window which opens a part of the conductive chip 8c.

Next, as shown in FIG. 3(h), a conductor chip 8d which is coupled with the end of the conductor chip 8c is deposited so that the end of the chip 8d is on the dielectric layer 7d.

Next, as shown in FIG. 3(i), a dielectric layer 7e is deposited with a window so that a part of the conductor chip 8d at the opposite end of the coupling portion with the conductor chip 8c is not covered with the dielectric layer 7e.

The above processes are repeated by the necessary times to obtain a coupling conductor 8B. The coupling conductor 8A in the inductor layer 1B is produced through similar processes.

Figure 5A:
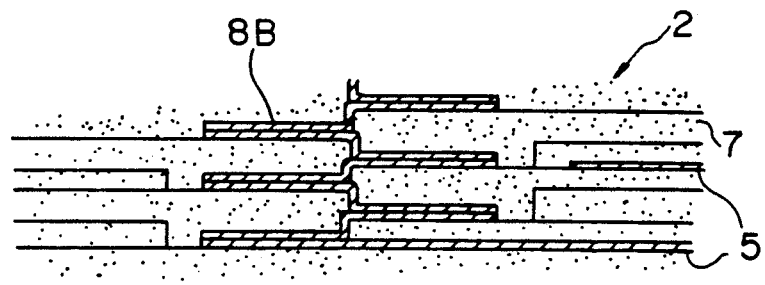
FIG. 5A shows cross section of inter-layers coupling conductors according to the present invention.

A coupling conductor 8B thus produced is in a zigzag shape, or a repeat of essentially S-shape as shown in FIG. 5A.

A coupling conductor is used for coupling inner elements, including an inductor, a capacitor, and/or a resistor with each other, and/or an external element, so that no side terminal 3 is used for the inner element coupling. The use of a coupling conductor allows a complicated circuit in the present multilayer hybrid circuit. For instance, a filter circuit shown in FIG. 4 having 17 coupling points (shown by a circle in the figure) may be mounted in a hybrid circuit of 5.0 mm×5.0 mm×2.8 mm size having only 12 side terminals.

It should be noted that a coupling conductor extends to the surface of the hybrid circuit when an external element mounted on the hybrid circuit is coupled through the coupling conductor.

Figures 5B, 5C:
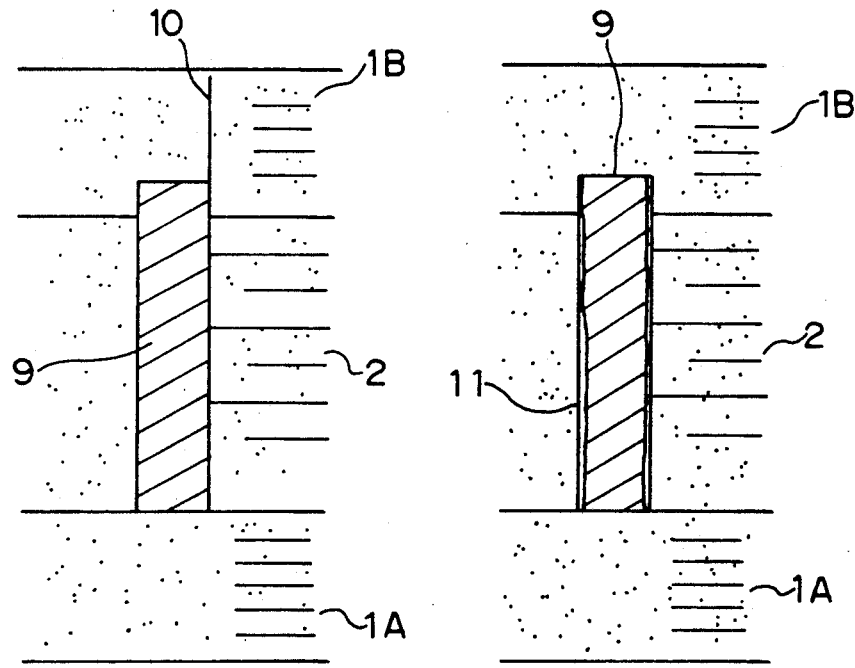
FIGS. 5B and 5C show the explanatory drawings of the operation of a prior art.

FIGS. 5B and 5C show for the explanation of the effect of the present coupling conductor. If a coupling conductor is implemented by a through hole filled with a conductor in a conventional manner as shown in FIGS. 5B and 5C, a small contraction or expansion in sintering process between a conductor in a through hole, and a dielectric layer or a ferrite layer would cause trouble.

When contraction of a conductor 9 is larger than that of a dielectric layer and/or a ferrite layer, undesirable stress is applied to dielectric layers and ferrite layers by a conductor as shown in FIG. 5B, and a crack 10 will be generated around the through hole. When contraction of a conductor 9 is smaller than that of dielectric layers and ferrite layers, a gap 11 would be generated between a through hole conductor 9 and dielectric layers or ferrite layers. That gap 11 would deteriorate the mechanical strength of a hybrid circuit.

On the other hand, according to the present invention, no crack nor gap is generated since a coupling conductor itself is in a laminated structure of S-shaped conductor chips and dielectric layers (or ferrite layers). Each conductive chip of the coupling conductor is very thin, and is provided between dielectric or ferrite layers.

Next, an inductor according to the present invention is described. It is well known that inductance is proportional to number of windings, so when large inductance is requested, number of turns is large according to the necessary inductance. However, in case of a multilayer hybrid circuit, the increase of number of turns causes the increase of the thickness of the circuit. As the thickness must be smaller than a requested value, the number of turns is restricted, and the necessary inductance is sometimes not obtained.

The basic idea of the present invention to solve the above problem and provide large inductance is to provide a plurality of windings each connected in series so that inductance is increased.

Figure 6:
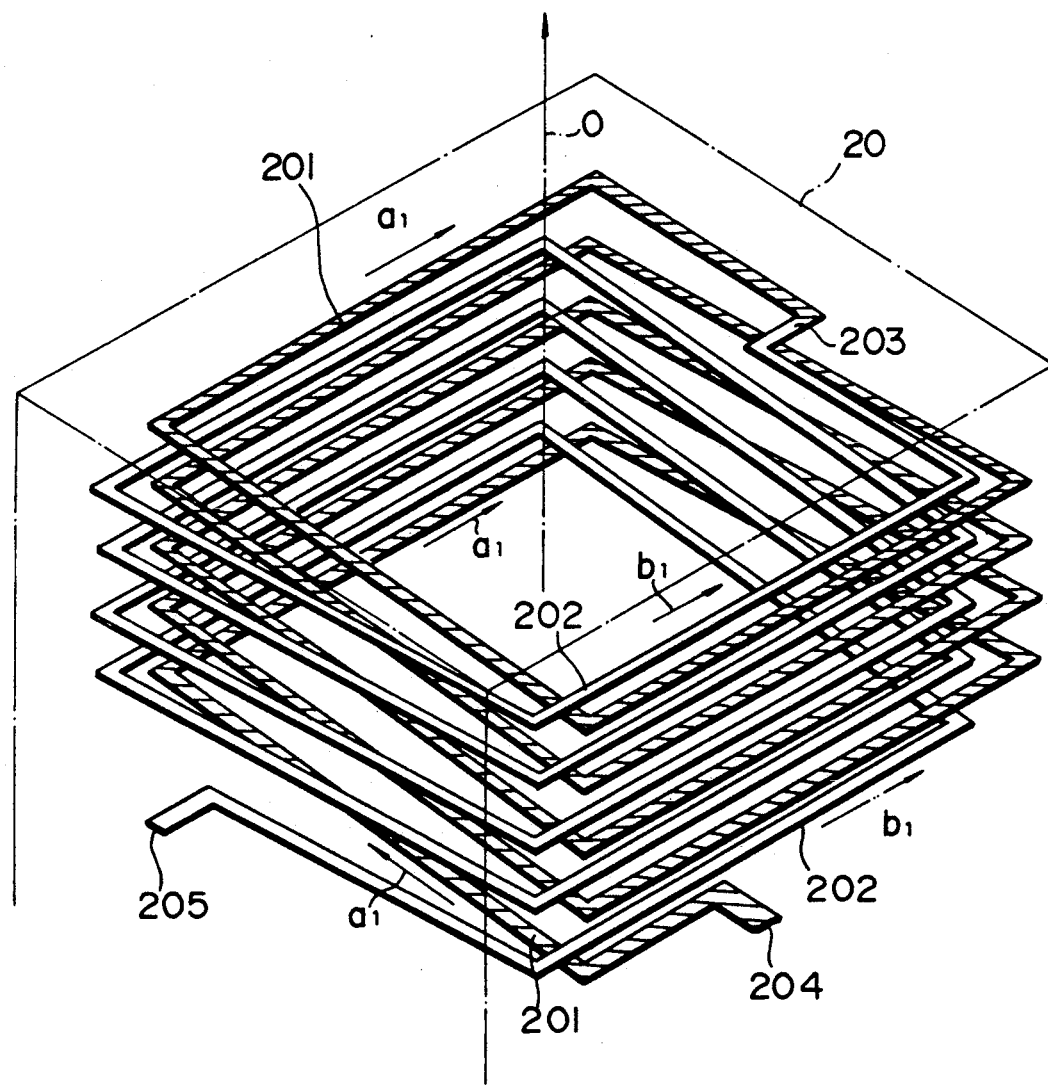
FIG. 6 shows a cross section of another embodiment of the present invention.

FIG. 6 shows an enlarged perspective view of a coil according to the present invention. In the figure, 20 is a ferromagnetic body, 201 and 202 are coils, 203 is a conductive coupling chip of two coils 201 and 202, and 204 and 205 are terminals of a series connected coil.

Each coil 201 and 202 is spiral or solinoid along the coil axis 0, and the coil axis of the first coil 201 resides within the other coil 202.

The winding direction $a_1$ of the first coil 201, is opposite to the winding direction $b_1$ of the second coil 202. Along the coil axis O, the coil 201 is wound in clockwise direction, and the other coil 202 is wound in anti-clockwise direction. One end of the coils 201 and 202 is coupled with each other by using a coupling conductor 203. As the winding direction of two coils is opposite to each other and one end of the first coil 201 is connected to one end of the other coil 202 on the plane including said ends of the coils 201 and 202, the current direction in the coil 201 is the same as that in the coil 202, and the coil 201 and coil 202 provide the flux in the same direction. The other ends 204 and 205 of the coils 201 and 202 are provided at one end of the series connected coil, and are connected to a side terminal, or inner components, or a coupling conductor.

As the coils 201 and 202 provide the flux in the same direction, the inductance of the series connected coil is four times as large as the inductance of each coil 201 or 202, provided that the number of turns of the coil 201 is the same as that of the coil 202.

The coils 201 and 202 are solenoids with the axis 0, and the axis 0 resides in both the solenoid plane. Therefore, the size of the series connected coils 201 and 202 is almost the same as the size of one coil 201 or 202. So, the size of the coil is small as compared with that of the inductance, and large inductance is obtained in a thin hybrid structure.

It should be noted that the coils 201 and 202 are wound in opposite direction, and the coupling conductor 203 connects two coils in series. Therefore, no through hole conductor is used for connecting two coils in series.

Figure 7:
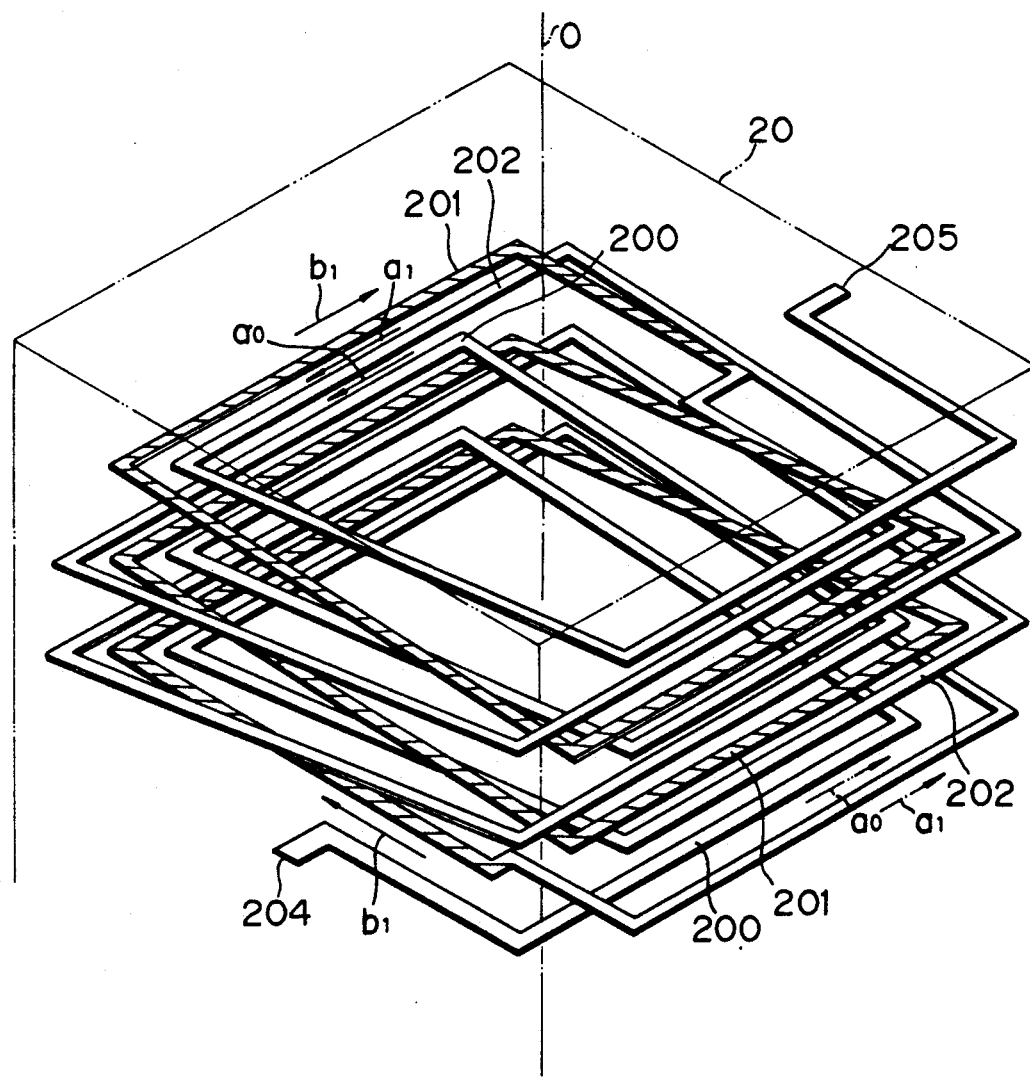
FIG. 7 shows a perspective view of a coil according to the present invention.

FIG. 7 shows the embodiment that three coils 200, 201 and 202 are connected in series. Those coils 200, 201 and 202 are solenoids with the axis O, which resides commonly in all the coils. The winding direction $a_0$ of the first coil 200 is opposite to that $b_1$ of the second coil 201, and the direction $b_1$ is opposite to the direction $a_1$ of the third coil 202.

Those coils 200, 201, and 202 generate the flux in the same direction.

It should be appreciated that more than four coils with a common axis may be connected in series in order to provide larger inductance.

Now, the producing process of the present inductor is described in accordance with FIG. 8. The present multilayer hybrid circuit is produced through printing process, photolithoetching process, sputtering process, evaporation process, and/or plating process. In the following embodiment, a thick film printing process is described.

Figure 8A:
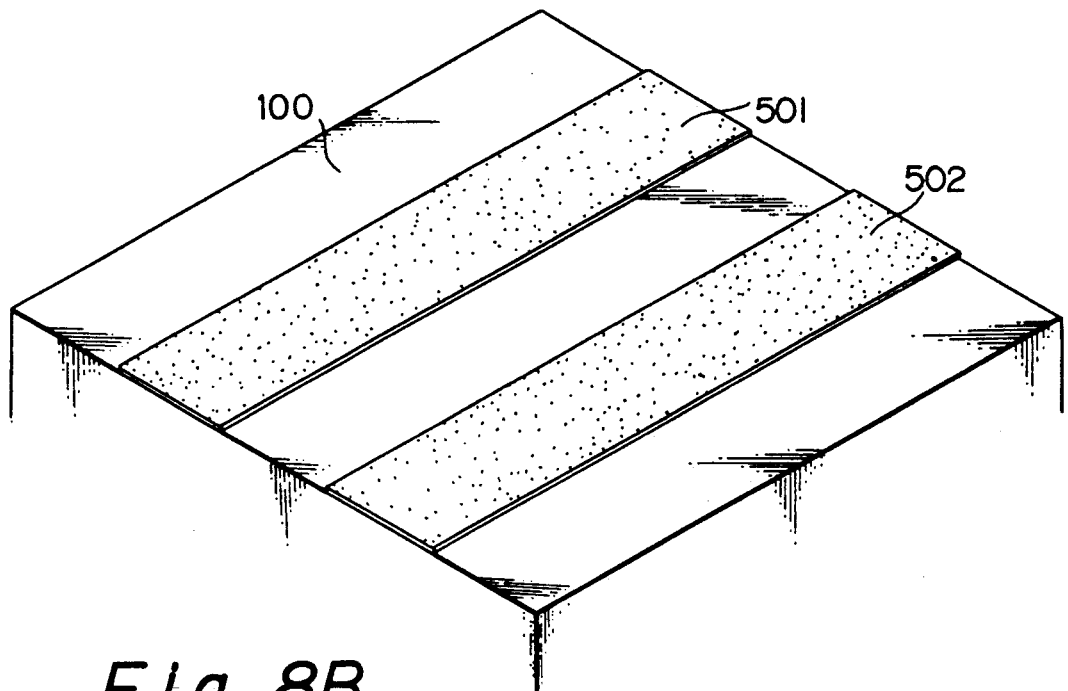
FIGS. 8(A) through 8(O) show producing steps of a coil according to the present invention.

First, a pair of elongated ferromagnetic layers 501 and 502 in stripe form are printed on a substrate 100 as shown in FIG. 8A. The substrate 100 is assumed to be a component which has been already laminated. Those magnetic layers 501 and 502 are produced through screen printing process of ferromagnetic paste which is the mixture of ferrite powder, binder and solvent. It should be noted that a ferrite layer is dielectric.

Figure 8B:
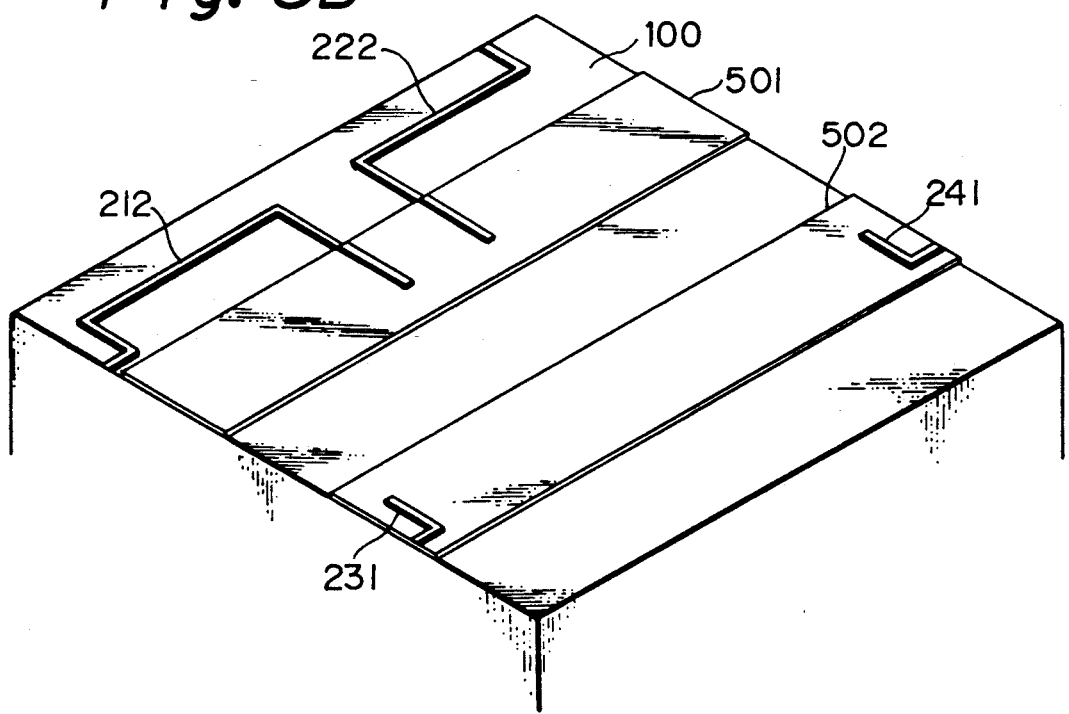

Next, as shown in FIG. 8B, conductor chips or lines 212, 222, 231 and 241 are printed on the magnetic layers 501 and 502, and the substrate. Those conductor chips function as a part of coils, and terminals of those coils.

Figure 8C:
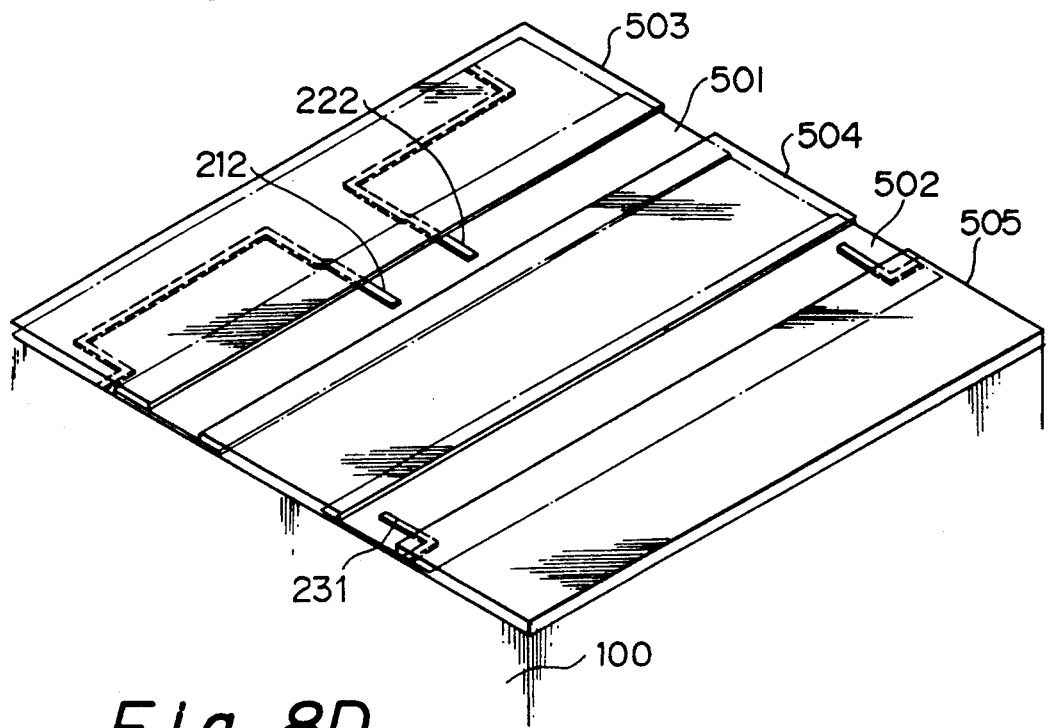

Next, as shown in FIG. 8C, the ferromagnetic layers 503 through 505 are printed so that the portions which are not covered with the first magnetic layers 501 and 502 are covered with the second magnetic layers 503, 504 and 505. The ends of the conductive chips 212, 222, 231 and 241 are not covered with the second magnetic layers.

Figure 8D:
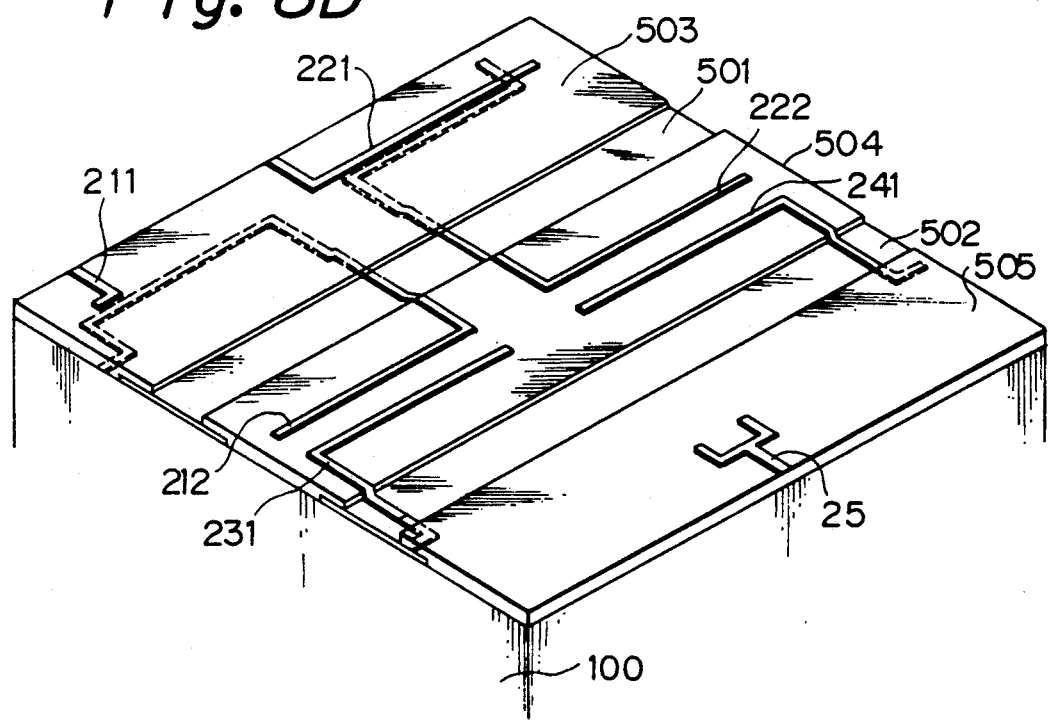

Next, as shown in FIG. 8D, conductive chips 22, 222, 231 and 241 are printed on the magnetic layer 504 so that those conductive chips 212, 222, 231, and 241 are connected to those which are printed in FIG. 8B. Simultaneously, the conductive chip 211 and 221 are printed on the magnetic layer 503, and the conductive chip 25 is printed on the magnetic layer 505.

Figure 8E:
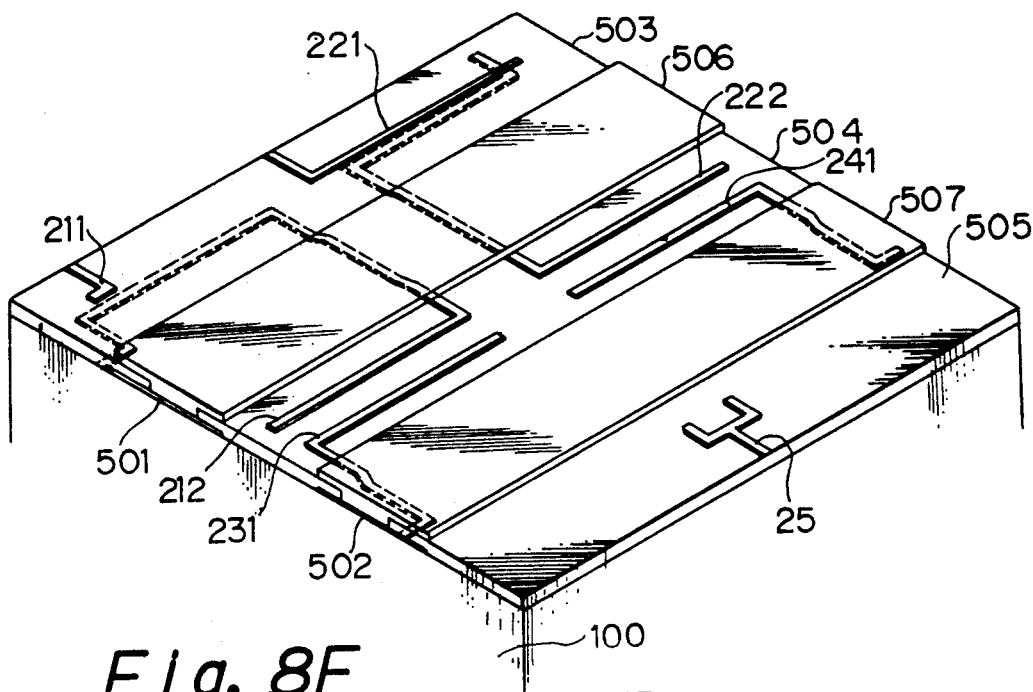

Next, as shown in FIG. 8E, the ferromagnetic layers 506 and 507 are printed so that the spacing between the layers 503 and 504, and the spacing between the layers 504 and 505 are filled.

Figure 8F:
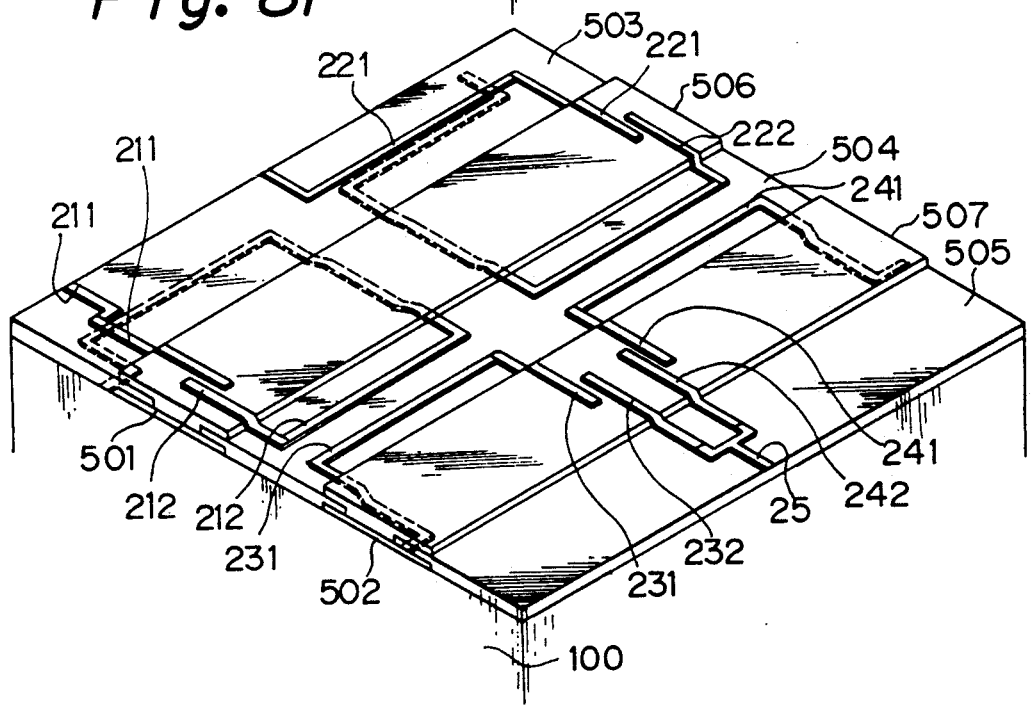
Figure 8G:
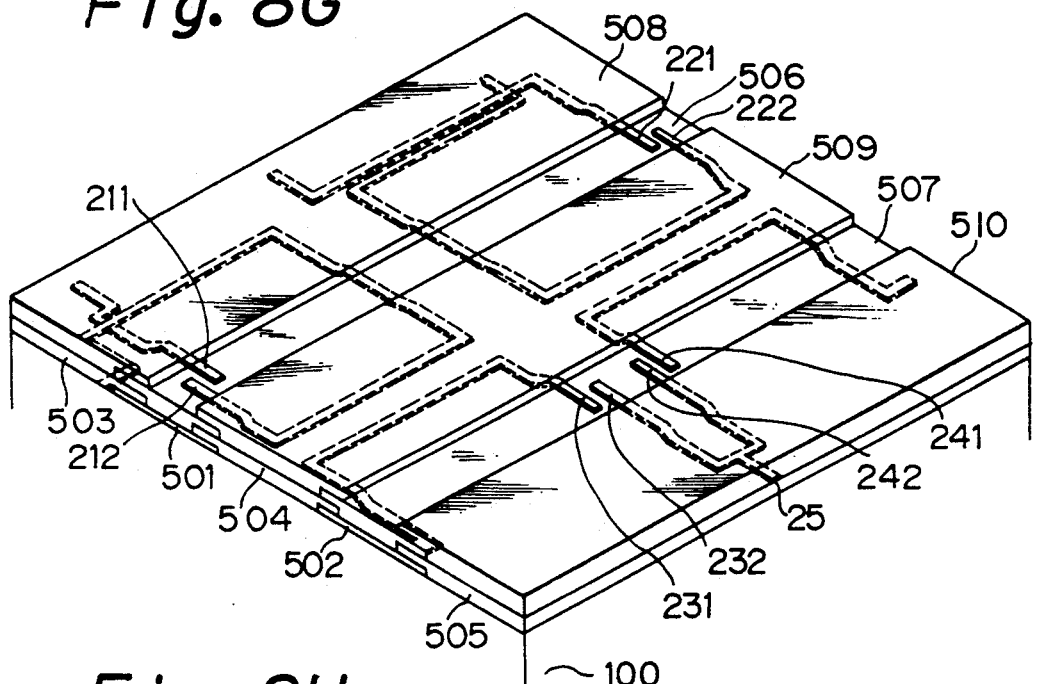
Figure 8H:
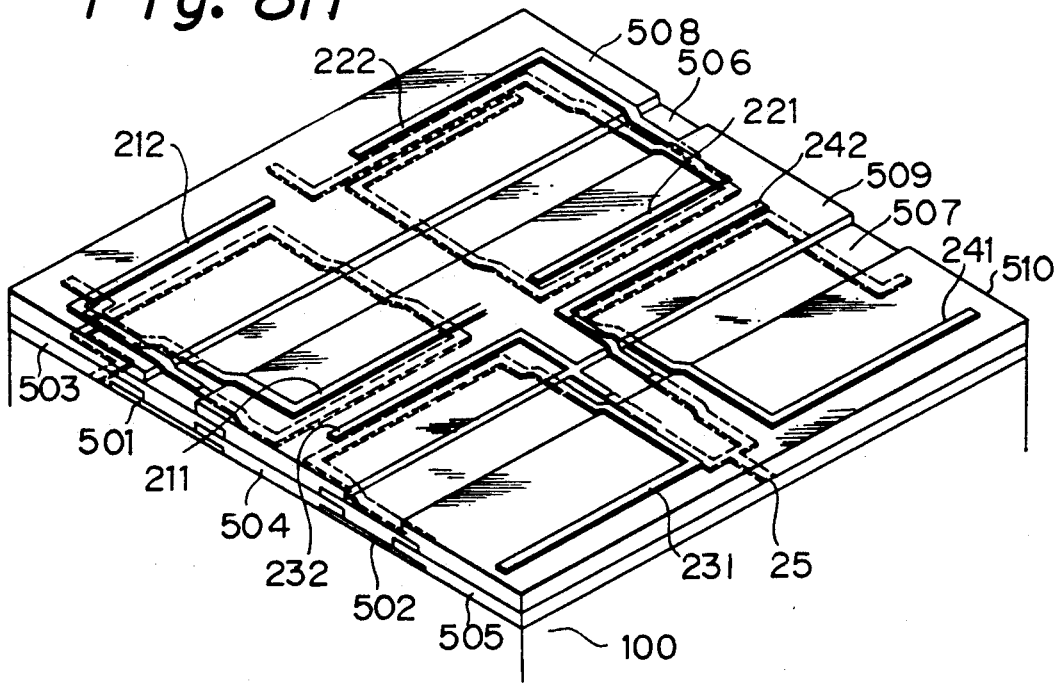
Figure 8I:
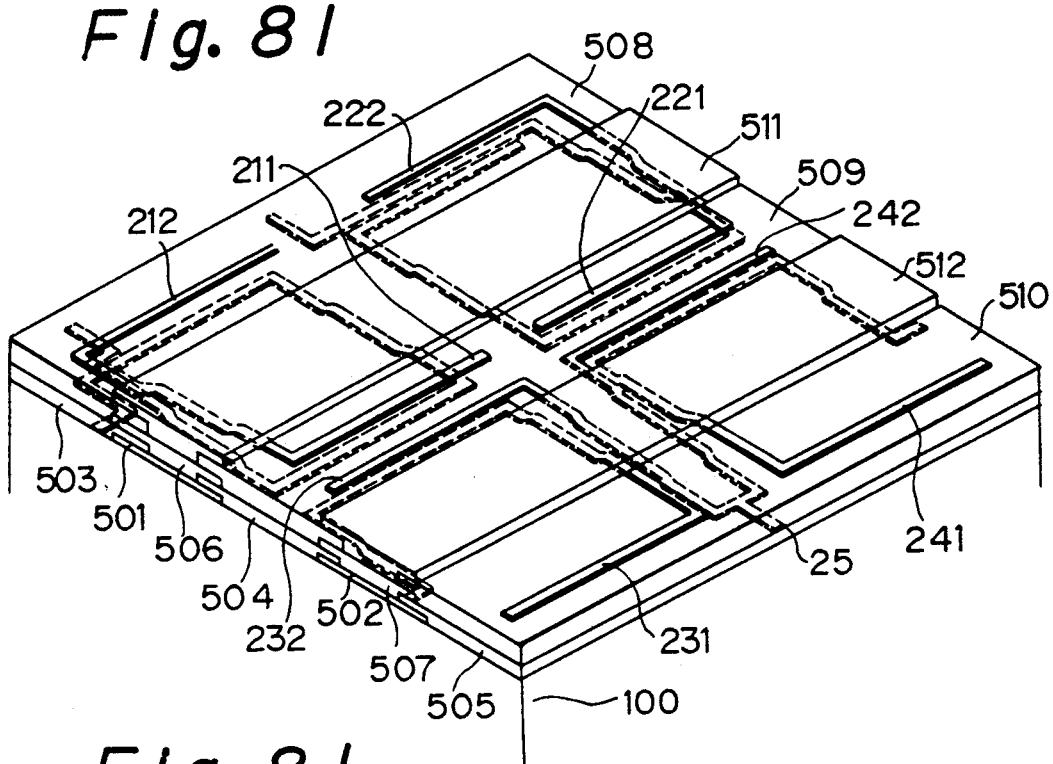
Figure 8J:
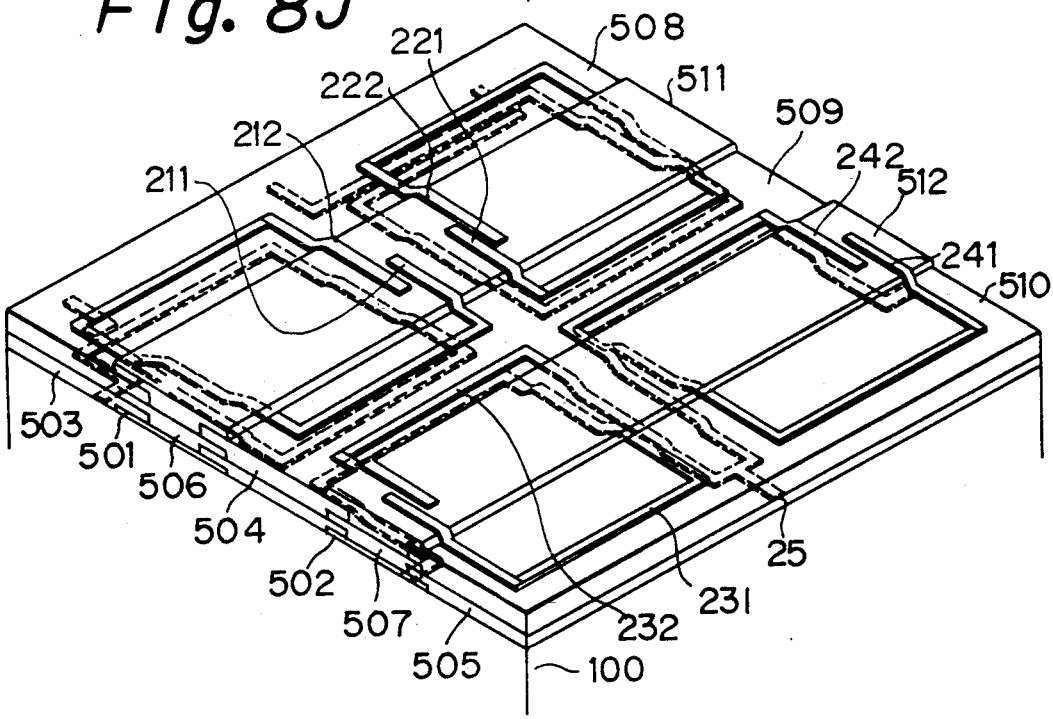
Figure 8K:
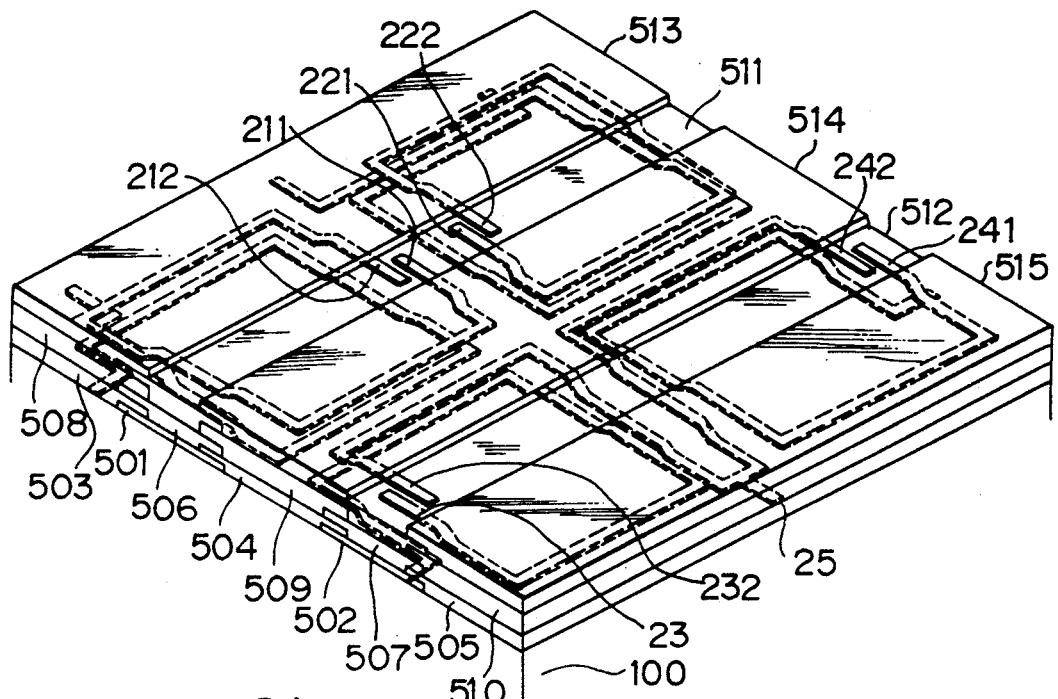
Figure 8L:
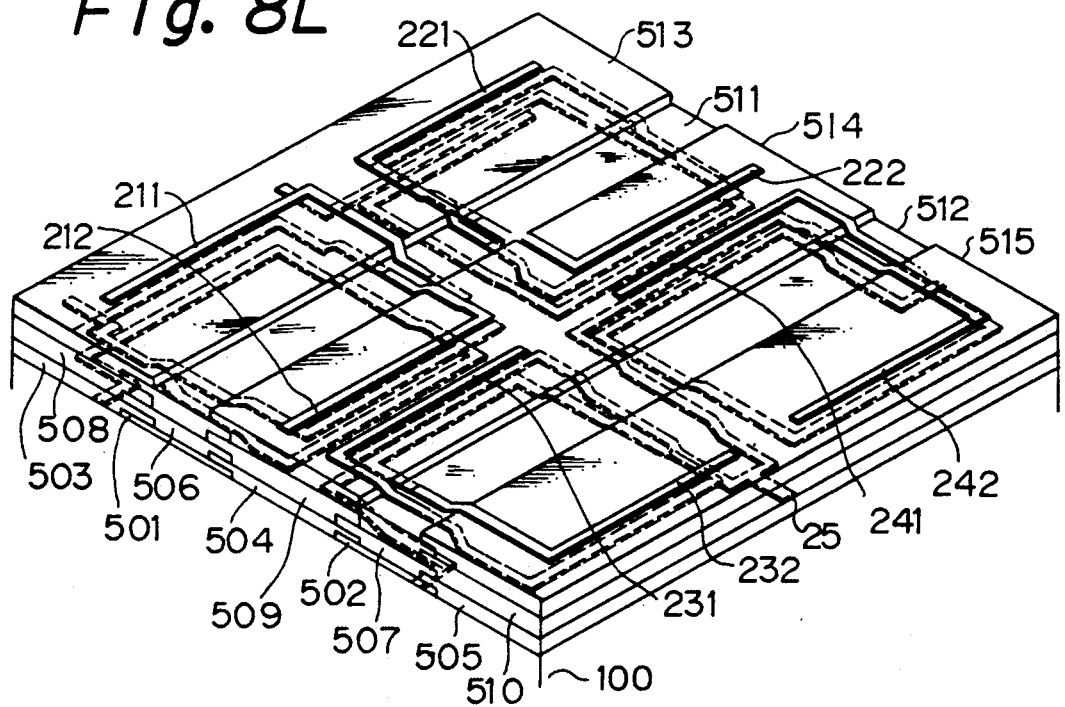
Figure 8M:
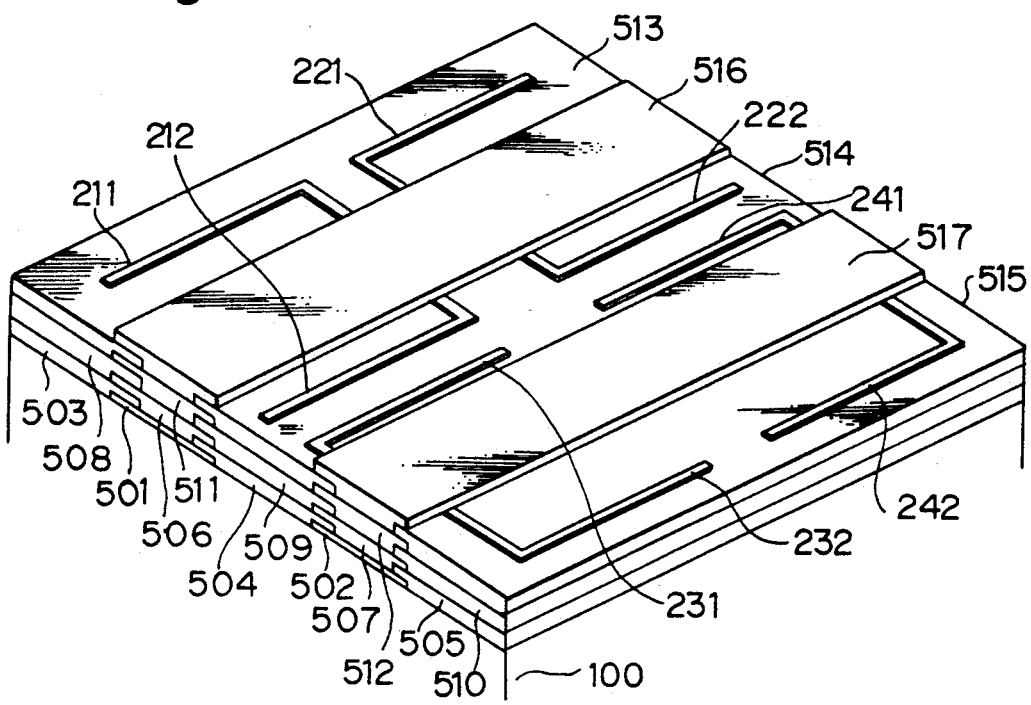
Figure 8N:
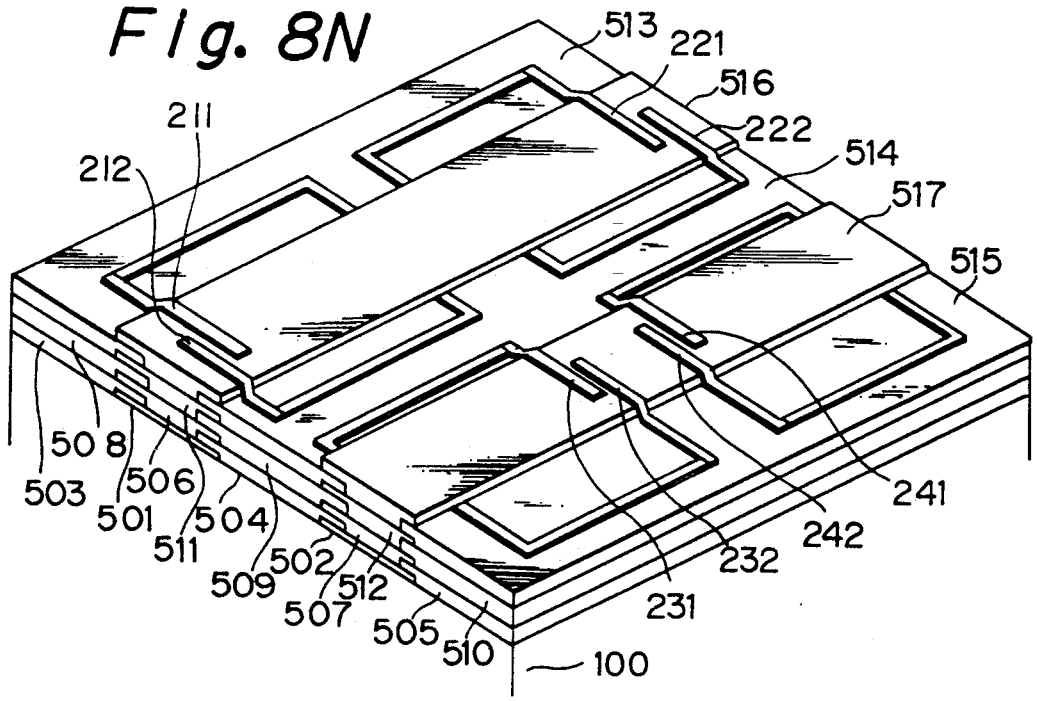

Next, as shown in FIG. 8F, the conductor chips 211 and 221 are provided on the magnetic layers 503 and 506 so that those chips 211 and 221 are connected to those which are printed in FIG. 8D. Simultaneously, the conductive chips 212 and 222 are printed on the magnetic layers 504 and 506 so those conductive chips 212 and 222 are connected to those which are printed in FIG. 8D. Further, the conductive chips 231 and 241 are printed on the magnetic layers 504 and 507 so that those conductive chips 231 and 241 are connected to those which are printed in FIG. 8D. Further, the conductive chips 232 and 242 are provided on the magnetic layers 505 and 507 so that those conductor chips 232 and 242 are connected to the conductor 25 on the magnetic layer 505. The conductor chips 211 and 212, 221 and 222, 231 and 232, and 241 and 242 are provided so that the former of each pair goes in opposite direction of the latter.

Similarly, as shown in FIG. 8G through 8N, the conductor chips (211,212) through (241, 242), and the ferromagnetic layers are printed according to the number of turns of the coils. The numerals 508 through 517 in those figures are ferromagnetic layers.

Figure 8O:
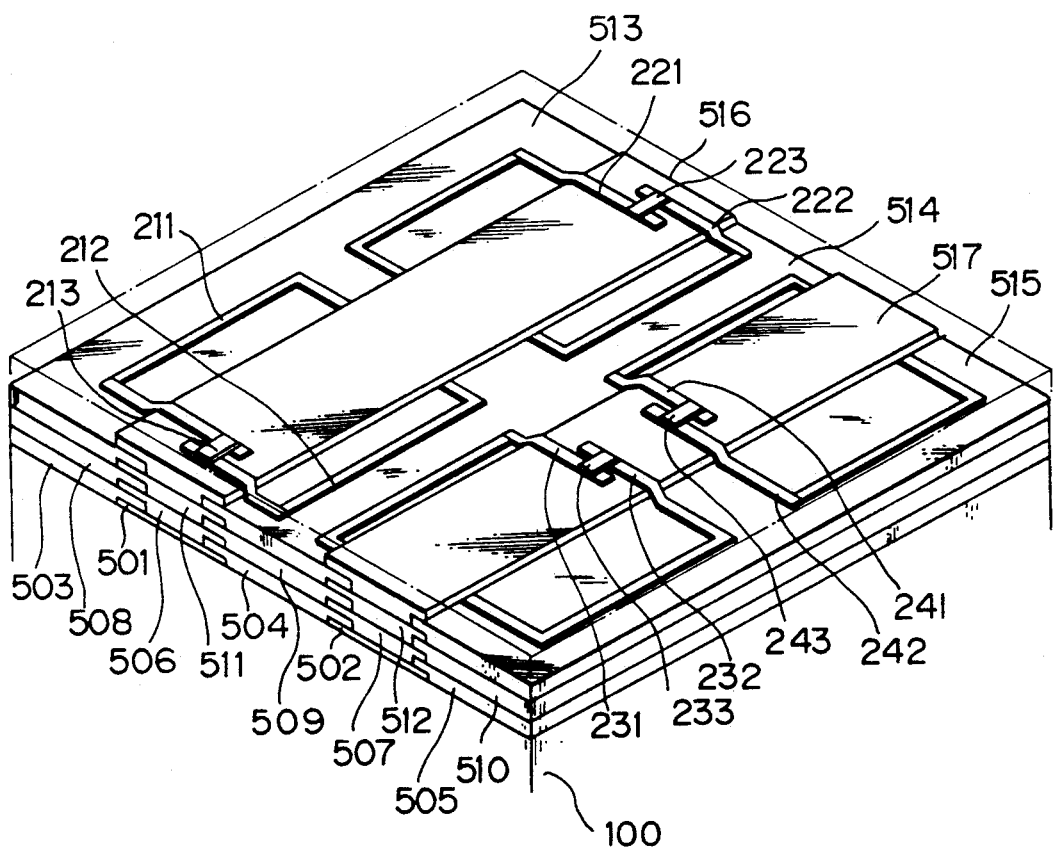

Finally, as shown in FIG. 8(O), the coupling chips 213, 223, 233 and 243 connects the ends of the coils (221, 212), (221, 222), (231, 232), and (241, 242), respectively. Then, four coils each of which has two serially connected coils are obtained.

As described, an inductor according to the present invention has a plurality of series connected coils so that large inductance is obtained in thin structure. As a plurality of coils are provided around the common axis, the total thickness of the coils is almost the same as a single coil, and therefore, the total size of an inductor is almost the same as that of a single coil. Further, as two coils are wound in opposite directions, the coupling chip for connecting the ends of two coils resides on a single plane, and no penetrating conductor is used for the connection of the two coils.

From the foregoing it will now be apparent that a new and improved multilayer hybrid circuit has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A multilayer hybrid circuit comprising an essentially flat-shaped laminated body which includes at least one selected from a capacitor, an inductor, and a resistor, and a plurality of side terminals provided on side walls of said laminated body for external connection of said capacitor, said inductor, and said resistor, said capacitor including a dielectric layer and conductive layers on said dielectric layer, said inductor including a dielectric ferromagnetic layer and a plurality of conductive wire layers composing a coil by sandwiching said dielectric ferromagnetic layer between conductive wire layers, said resistor including a dielectric layer and a resistor layer deposited on said dielectric layer together with a conductive layer as a lead line, a coupling conductor penetrating said dielectric layers of at least one of said capacitor, said inductor, and said resistor, in perpendicular direction to the dielectric layer plane, for connecting conductive patterns on different dielectric layers, a plurality of said dielectric layers each having a hole to accept said coupling conductor, the positions of said holes being alternately shifted, and said coupling conductor comprising a plurality of elongated conductive chips in essentially S-shape through said holes in said plurality of dielectric layers, each of said conductive chips being deposited partly on an adjacent conductor chip and partly on a dielectric layer so that a succession of the conductor chips forms an elongated conductor perpendicular to the dielectric layer plane through said holes in dielectric layers.

2. A multilayer hybrid circuit according to claim 1, wherein said selected at least one comprises an inductor having a plurality of coils having an essentially common axis wound in opposite directions and connected in series on the plane where one end of each coil resides so that flux of each coil is in the same direction, and wherein conductive wire layers composing a part of each coil are deposited on the same dielectric ferromagnetic layer surfaces.

3. The multilayer hybrid circuit according to claim 2, wherein said at least one inductor includes further dielectric ferromagnetic layers, and wherein each of said coils has conductors which compose part of the coil deposited on the surfaces of several of said dielectric ferromagnetic layers, so that the body of each coil extends the width of several dielectric ferromagnetic layers in the direction of said axis.

4. The multilayer hybrid circuit according to claim 3, wherein, for each of several of said dielectric ferromagnetic layers, conductive wire layers composing a part of each coil are deposited on the same dielectric ferromagnetic layer surfaces.

5. A multilayer hybrid circuit according to claim 1, wherein the length of shift is in the range between 300 $\mu$m and 1200 $\mu$m.

6. A multilayer hybrid circuit according to claim 1, wherein said laminated body mounts an electronic component on said body.

7. A multilayer hybrid circuit according to claim 1, wherein the through holes on successive dielectric layers are laterally adjacent.

8. A multilayer hybrid circuit comprising an essentially flat-shaped laminated body which includes at least one inductor and at least a further one selected from a capacitor, and a resistor, and a plurality of side terminals provided on side walls of said laminated body for external connection of said capacitor, said inductor, and said resistor, said capacitor including a dielectric layer and conductive layers on said dielectric layer, said inductor including a dielectric ferromagnetic layer and a plurality of conductive wire layers composing a coil by sandwiching said dielectric ferromagnetic layer between conductive wire layers, said resistor including a dielectric layer and a resistor layer deposited on said dielectric layer together with a conductive layer as a lead line, said at least one inductor having a plurality of coils having an essentially common axis wound in opposite directions and connected in series on the plane where one end of each coil resides so that flux of each coil is in the same direction, and wherein conductive wire layers composing a part of each coil are deposited on the same dielectric ferromagnetic layer surfaces.

9. A multilayer hybrid circuit according to claim 8, wherein two coils are connected in series.

10. A multilayer hybrid circuit according to claim 8, wherein three coils are connected in series.

11. The multilayer hybrid circuit according to claim 8, wherein said at least one inductor includes further dielectric ferromagnetic layers, and wherein each of said coils has conductors which compose part of the coil deposited on the surfaces of several of said dielectric ferromagnetic layers, so that the body of each coil extends the width of several dielectric ferromagnetic layers in the direction of said axis.

12. The multilayer hybrid circuit according to claim 11, wherein, for each of several of said dielectric ferromagnetic layers, conductive wire layers composing a part of each coil are deposited on the same dielectric ferromagnetic layer surfaces.

* * * * *